United States Patent [19]

Hanawa et al.

[11] Patent Number: 4,806,867
[45] Date of Patent: Feb. 21, 1989

[54] MAGNETIC RESONANCE IMAGING SYSTEM

[75] Inventors: Masatoshi Hanawa; Hiroshi Hayakawa, both of Ootawara, Japan

[73] Assignee: Kabushiki Kaisha Toshiba, Kawasaki, Japan

[21] Appl. No.: 52,874

[22] Filed: May 22, 1987

Related U.S. Application Data

[63] Continuation-in-part of Ser. No. 829,486, Feb. 14, 1986, Pat. No. 4,675,608.

[30] Foreign Application Priority Data

Feb. 19, 1985 [JP] Japan .................................. 60-32283

[51] Int. Cl.⁴ ......................................... G01R 33/20
[52] U.S. Cl. ..................................... 324/314; 324/309
[58] Field of Search ............... 324/307, 309, 312, 314, 324/318, 322, 313; 364/414

[56] References Cited

U.S. PATENT DOCUMENTS

| | | | |
|---|---|---|---|
| 3,039,048 | 6/1962 | Shoolery | 324/314 |
| 3,112,441 | 11/1983 | Robinson | 324/314 |
| 3,725,776 | 4/1973 | Petrinovic | 324/314 |
| 3,921,060 | 11/1975 | Ekimovskikh et al. | 324/315 |
| 4,297,637 | 10/1981 | Crook et al. | 324/309 |
| 4,329,646 | 5/1982 | Tsuda | 324/307 |
| 4,443,760 | 4/1984 | Edelstein et al. | 324/309 |
| 4,532,474 | 7/1985 | Edelstein | 324/309 |
| 4,558,277 | 12/1985 | Post et al. | 324/309 |
| 4,625,171 | 11/1986 | Sekihara et al. | 324/312 |
| 4,740,750 | 4/1988 | Machida | 324/312 |

FOREIGN PATENT DOCUMENTS 58-87450 5/1983 Japan .
59-38637 3/1984 Japan .

OTHER PUBLICATIONS

Fukushima et al., *Experimental Pulse NMR a Nuts and Bolts Approach*, Addison–Wesley Pub., 1981.
Signa System Operation Manual, vol. 3, *Patient Preparation and The MR Exam*, 10,26/84.

Primary Examiner—Stewart J. Levy
Assistant Examiner—Kevin D. O'Shea
Attorney, Agent, or Firm—Foley & Lardner, Schwartz, Jeffery, Schwaab, Mack, Blumenthal & Evans

[57] ABSTRACT

The magnetic resonance imaging system applies a uniform static magnetic field and a gradient magnetic field to an object and further applies an excitation rotating magnetic field to cause magnetic resonance phenomena in the object to detect the induced magnetic resonance signals and then to obtain image data by processing the magnetic resonance signals. The system has a power controller for controlling the transmission power in a transmitter for transmitting the excitation rotating field. The system further has a transmission controller for controlling the power controller in response to the magnetic resonance signal which is received by the receiver from the object. The transmission controller controls the power controller to sequentially change the transmission power and detects the transmission power at which the maximum magnetic resonance signal is obtained in response to the reception signal by the receiver when the excitation rotating field is applied to the object, thereby controlling the power controller in accordance with the detected data. A fraction of the detected maximum power is utilized to generate the excitation field to thereby rotate the spin angle of the nuclei by an amount less than 90°, and preferably 45°, so as to reduce data collection time.

13 Claims, 5 Drawing Sheets

F I G. 3
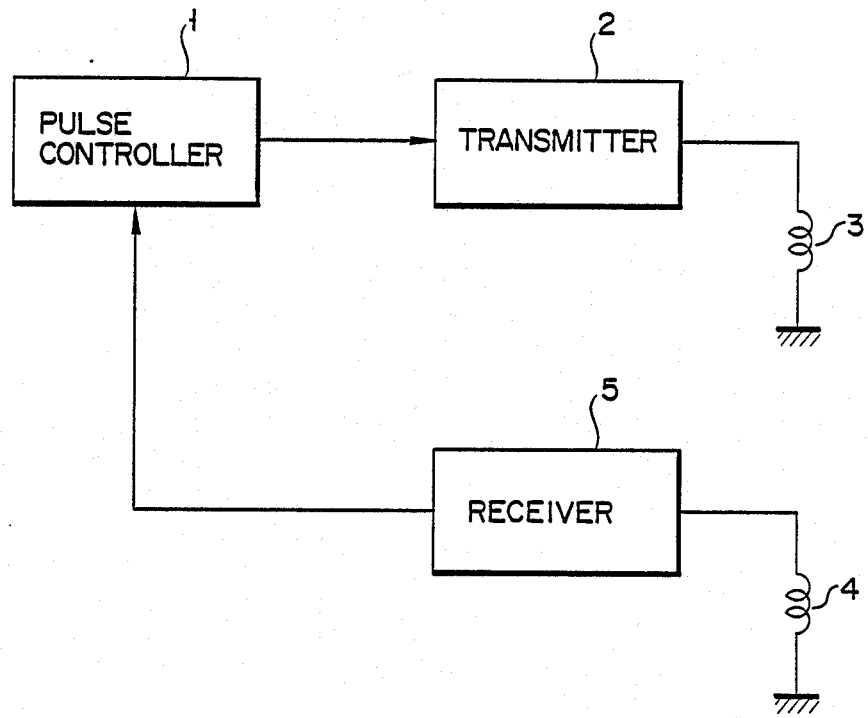

MAGNETIC RESONANCE IMAGING SYSTEM

CROSS REFERENCE TO RELATED APPLICATION

This application is a continuation-in-part of U.S. patent application Ser. No. 829,486 filed Feb. 14, 19868, now U.S. Pat. No. 4,675,608, "Magnetic Resonance Imaging System."

BACKGROUND OF THE INVENTION

The present invention relates to a magnetic resonance imaging (MRI) system for imaging an object based upon a function of the spin density distribution of the specific nucleus existing in a specified cross section of the object (e.g., the density distribution of the nuclear spin), the spin lattice relaxation time ($T_1$) and the spin relaxation time ($T_2$) of the nucleus, thereby to form an MR image.

Various MR techniques have been proposed including a projection method described below.

In this system, a sufficiently uniform static magnetic field $H_O$ is applied to object P as shown in FIG. 1 and a gradient magnetic field $G_z$ is further applied to object P due to a pair of gradient coils $C_{Ia}$ and $C_{Ib}$ in addition to the static magnetic field $H_O$. The direction of the lines of magnetic force of the static magnetic field $H_O$ is parallel to the Z axis shown in the diagram. The magnetic force of the gradient magnetic field $G_z$ is parallel to the Z axis shown in the diagram and this gradient magnetic field has a linearly ascending gradient with respect to the direction of the Z axis (namely, the magnetic field intensity gradually changes with respect to the Z axis). The magnetic gradient of gradient magnetic field $G_z$ is such that, for example, the magnetic field intensity in the vicinity of substantially a central portion of the object along the direction of the Z axis is zero and the directions of lines of magnetic forces before and after the central portion are oppositely directed and at the same time the magnetic field intensity gradually increases. Thus, the composite magnetic field of the static magnetic field $H_O$ and the gradient magnetic field $G_z$ also has a magnetic gradient with respect to the Z-axis direction, so that magnetic field contour planes are formed in planes perpendicular to the Z axis. Namely, in this case, a specific magnetic field contour plane corresponds to a specific magnetic field intensity wherein a substantial central portion with respect to the Z-axis direction corresponds to the intensity of magnetic field $H_O$.

The atomic nuclei resonate under the static magnetic field $H_O$ at an angular frequency of $$\omega_O = \gamma H_O \qquad (1)$$

In expression (1), $\gamma$ is a gyromagnetic ratio which is peculiar to the atomic nucleus and is determined depending on the kind of atomic nucleus.

In addition to static magnetic field $H_O$ and gradient magnetic field $G_z$, an additional, excitation magnetic field $H_1$ corresponding to the angular frequency $\omega_O$ functions to resonate only the specific atomic nucleus, and is applied to object P as a pulse through a pair of transmitter coils $C_{2a}$ and $C_{2b}$ provided in a probe head. This pulsed field $H_1$ is called an "excitation pulse." The excitation field $H_1$ substantially selectively acts on only the portion of the X-Y plane shown in the diagram (which is selectively determined with respect to the Z-axis direction) due to the gradient magnetic field $G_z$. Thus, the MR phenomenon occurs in only the specific slice portion S (although it is a plane portion, it actually has a certain thickness), from which two-dimensional or three-dimensional images are obtained.

Due to the occurrence of the MR phenomenon, a free induction decay (FID) signal is detected through a pair of receiver coils $C_{3a}$ and $C_{3b}$ provided in the probe head. This FID signal is subjected to a Fourier transformation, so that a single spectrum representative of a one-dimensional projection of the nuclear spin density integrated over planes perpendicular to the direction of the gradient is derived with respect to the rotating frequency of the specific atomic nuclear spin. To obtain two-dimensional or three-dimensional images, the projection data of slice portion S regarding multi directions of the magnetic field gradient in the X-Y plane is necessary. Therefore, after the MR phenomenon is caused by exciting slice portion S, as shown in FIG. 2, a gradient magnetic field $G_{xy}$ having a magnetic gradient which is linear in the direction of the X' axis (coordinate axis which is rotated by an angle of $\theta$ from the X axis) is allowed to act on magnetic field Hn (by a coil or the like—not shown). Thus, magnetic field contour lines $E_l$ to $E_n$ in slice portion S (X-Y plane) of object P become straight lines which perpendicularly cross the X' axis. The rotating frequencies of the specific atomic nuclear spins projected on magnetic field contour lines $E_l$ to $E_n$ are expressed by expression (1) mentioned above. Signals $D_l$ to $D_n$ corresponding to the FID signals are caused by the magnetic fields on magnetic field contour lines $E_l$ to $E_n$, respectively. Amplitudes of these signals $D_l$ to $D_n$ are proportional to densities of the specific atomic nuclear spins on magnetic field contour lines $E_l$ to $E_n$ which pierce slice portion S, respectively. However, the FID signal which is actually observed is a composite FID signal (labeled FID in FIG. 2) made up of the sum of all of $D_l$ to $D_n$. This composite FID signal FID is subjected to the Fourier transformation, so that projection data (one-dimensional image) PD of slice portion S onto the X' axis is obtained. The X' axis is rotated in the X-Y plane. This may be achieved by providing a gradient magnetic field $G_x$ for providing a magnetic gradient with regard to the X direction by a pair of gradient coils, and at the same time by providing a gradient magnetic field $G_y$ for providing a magnetic gradient with respect to the Y direction by another pair of gradient coils. These gradient magnetic fields $G_x$ and $G_y$ are combined to form a gradient magnetic field $G_{xy}$, and by changing the ratio of the gradient magnetic fields $G_x$ and $G_y$, it is possible to rotate or change the direction of the gradient magnetic field $G_{xy}$. Due to this, the projection data regarding each direction in the X-Y plane can be derived in a manner similar to that described above. The MR image can be synthesized by an image reconstruction process using the projection data.

Although there is a case where the FID signal due to the magnetic resonance is observed by directly detecting the FID signal itself, there is also a case where the magnetic resonance is excited so as to generate a spin echo signal relative to the FID signal and this spin echo signal is detected, thereby enabling observation of the FID signal.

A 90° pulse and/or a 180° pulse is used as an exciting pulse in order to obtain the FID signal or spin echo signal. The 90° pulse is the exciting pulse for causing such a magnetic resonance as to rotate the magnetic moment of the spin system by an angle of 90° from the direction parallel to the magnetic field to the direction which is normal thereto due to the resonance. Similarly, the 180° pulse is the exciting pulse for causing such a magnetic resonance as to rotate the magnetic moment of the spin system by an angle of 180°. The 90° pulse is mainly used to obtain the sole FID signal. Both of the 90° and 180° pulses are frequently used to obtain the spin echo signal.

The conventional diagnostic MRI system encounters a problem. Even if the condition to generate the 90° or 10° pulse has been preset, the power condition of the pulse will inevitably change since, when the object is put into the transmitter coils, the quality factor (Q) and resonance frequency ($f_O$) of the coils alter depending on attributes of the object, for example, the shape. Thus, the angle of inclination of the magnetic moment of the spin system deviates from the set value of 90° or 180° when the exciting pulse is applied. Consequently, picture quality features, e.g., contrast, S/N ratio, or the like of the MR image which are obtained from the FID signal or spin echo signal, vary depending on the attributes of the object. Moreover, conventional imaging techniques take considerable time to obtain the desired series of cross-sectional images and it would be advantageous to shorten this time as much as possible without unduly destroying image quality.

SUMMARY OF THE INVENTION

It is an object of the present invention to provide an MRI system of a relatively simple construction which can properly set the power condition irrespective of object attributes and can obtain a uniform magnetic resonance image.

It is another object of the invention to shorten the time required for obtaining the NMR image.

Yet another object of the invention is to shorten the time required for NMR imaging while not unduly sacrificing the S/N ratio of the received signals.

In an MRI system according to the present invention, the excitation rotating magnetic field is transmitted while sequentially changing the transmission power to generate the excitation rotating magnetic field, and at the same time the MR signals due to the different excitation rotating magnetic fields of the transmission powers are received from the object. These received MR signals are discriminated and the transmission power at which the maximum received MR signal is obtained is detected. The power condition of the transmitting pulse is controlled in accordance with the value of this transmission power such that the angle of inclination of the magnetic moment of the spin system becomes a predetermined value independently of the attributes of the object. The predetermined value is selected to achieve a fast data collection time without unduly sacrificing the S/N ratio. To achieve these fast data collection times a spin rotation angle of less than 90° is employed, most preferably an angle of 45°.

According to the MRI system of the invention, the optimum power condition is set irrespective of object attributes, so that uniform magnetic resonance images can be obtained in a reasonably short time.

BRIEF DESCRIPTION OF THE DRAWINGS

FIG. 3 is a block diagram showing a schematic arrangement of an MRI system according to an embodiment of the invention;

DETAILED DESCRIPTION OF THE PREFERRED EMBODIMENTS

FIG. 3 shows a schematic arrangement of an MRI system according to an embodiment of the present invention. In FIG. 3, a very simplified diagram of the arrangement of the system is shown.

Figure 1:
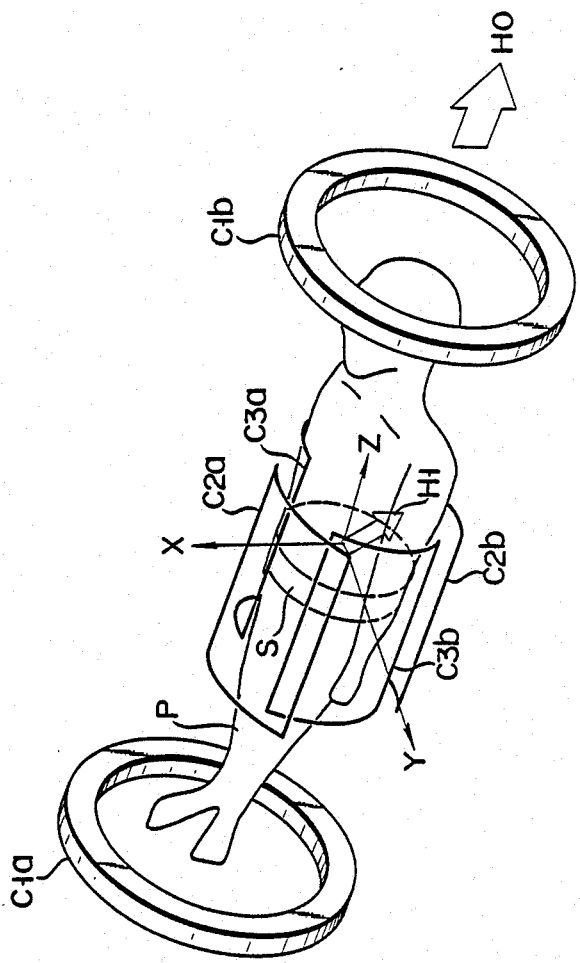
FIG. 1 is a diagram for explaining the principle of an MRI system.
Figure 2:
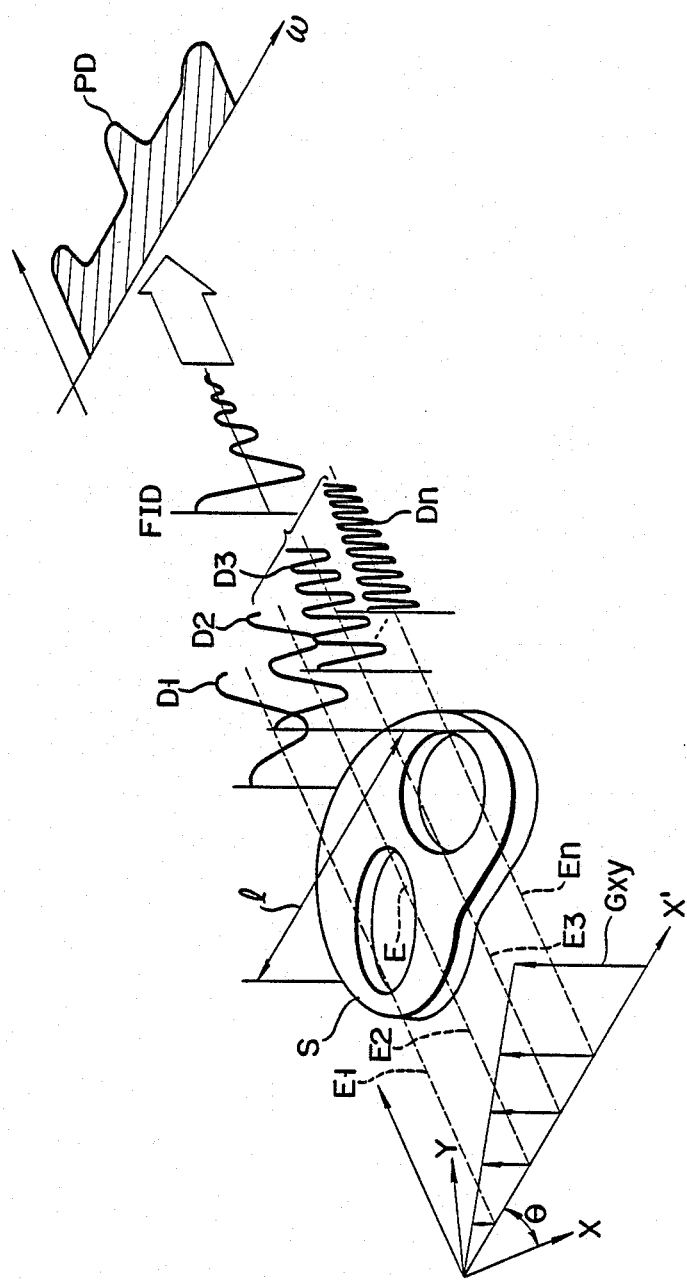
FIG. 2 is a diagram for explaining the principle to obtain the projection data due to the MR phenomenon.

This MRI system comprises, as a fundamental arrangement, transmitting pulse controller transmitter 2, transmitter coil 3 (corresponding to transmitter coils $C_{2a}$ and $C_{2b}$ shown in FIG. 1), receiver coil 4 (corresponding to receiver coils $C_{3a}$ and $C_{3b}$ shown in FIG. 1), and receiver 5. (It is obvious that in addition to those components, there is also provided an apparatus to apply a static magnetic field and gradient magnetic fields to an object.)

Controller includes, for example, a CPU (central processing unit) which performs the control operation. Transmitting pulse controller 1 changes the transmitting pulse power which is supplied to transmitter coil 3 for generating an excitation magnetic field in accordance with the attributes of an object (not shown) in a manner such that an angle of inclination of the magnetic moment of the spin system becomes a predetermined value. Practically speaking, for example, in the case of receiving a spin echo signal from the object through receiver coil 4, an excitation magnetic field $H_I$ is applied to the object while preliminarily sequentially changing the transmitting pulse power within a predetermined range, thereby obtaining the value of the transmitting pulse power, Pmax, at which the peak value of the received echo signal becomes a maximum.

After the transmitting pulse power Pmax is determined, a fraction, $P_F$, of the value of Pmax is selected so as to rotate the nuclei spin by a desired rotation or flip angle. The desired rotation angle is selected to be less than 90° so as to decrease data collection times. The smaller the rotation angle, the faster the data may be collected; however, the shorter the rotation angle, the smaller is the S/N ratio. Thus, most preferably, the desired rotation angle is selected to be 45° which permits a relatively short data collection time while still maintaining an acceptable S/N ratio.

Figure 4:
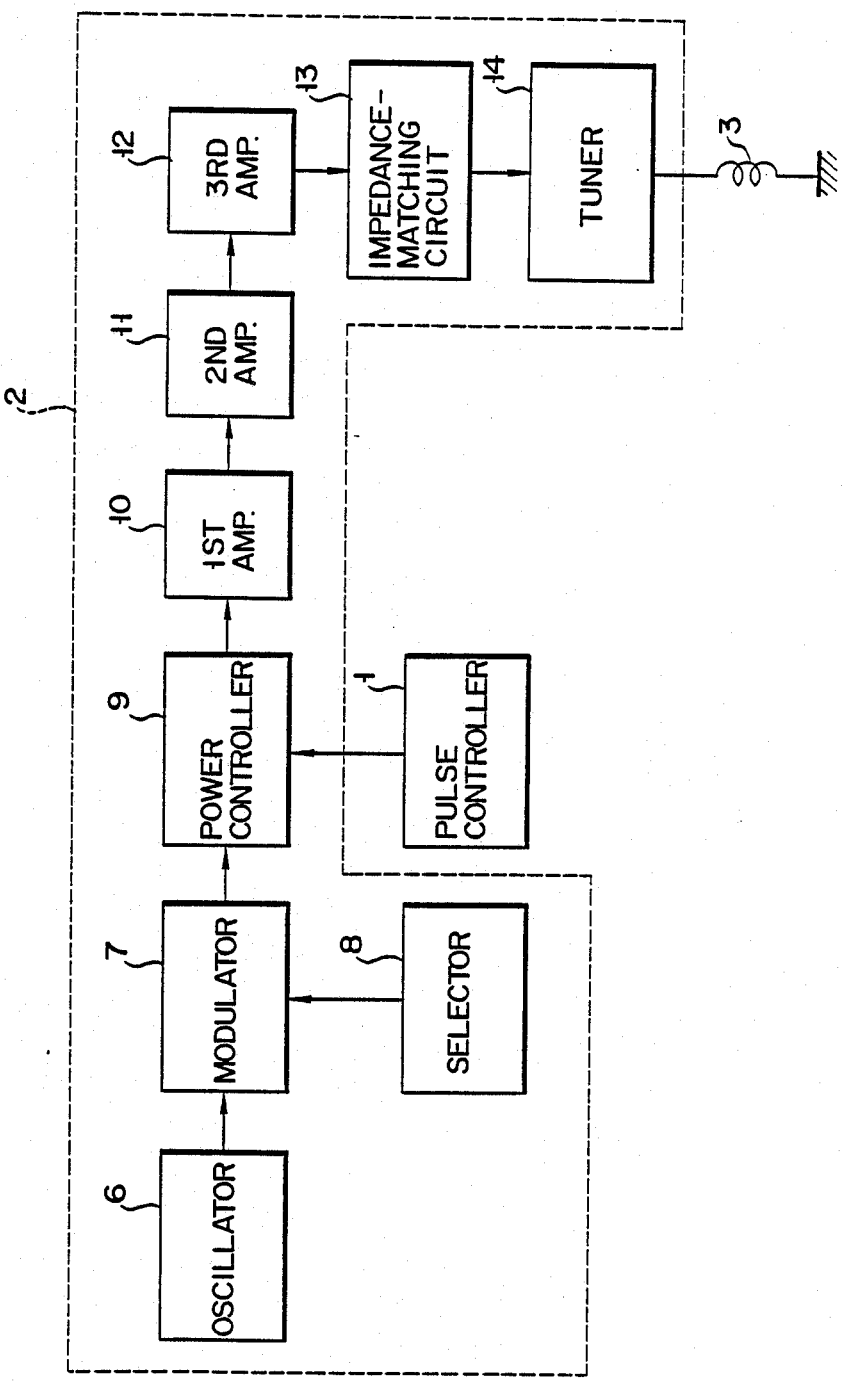
FIG. 4 is a block diagram showing a detailed arrangement of a transmitting section in the system of FIG. 3.

Transmitter 2 will now be described in detail with reference to FIG. 4 showing its arrangement.

As shown in FIG. 4, transmitter 2 comprises: oscillator 6; modulator 7; selector 8; power controller 9; first amplifier 10; second amplifier 11; third amplifier 12; impedance matching circuit 13; and tuner 14.

Oscillator 6 generates a continuous wave. Modulator 7 amplitude-modulates, by pulse wave, the continuous wave output from oscillator 6. Selector 8 is used to select an amplitude and/or a width of the pulse wave serving as a modulating wave in modulator 7. Power controller 9 controls an output of modulator 7 in response to controller 1 and eventually variably controls the transmitting pulse power. First to third amplifiers 10 to 12 constitute a radio frequency (RF) amplifier consisting of three stages. First amplifier 10 amplifies an output of power controller 9. Second amplifier 11 amplifies an output of first amplifier 10. Third amplifier 12 as the last stage amplifier amplifies an output of second amplifier 11. An output of third amplifier 12 is connected to tuner 14 and transmitter coil 3 through impedance matching circuit 13. Tuner 14 is used to tune transmitter coil 3.

Figure 5:
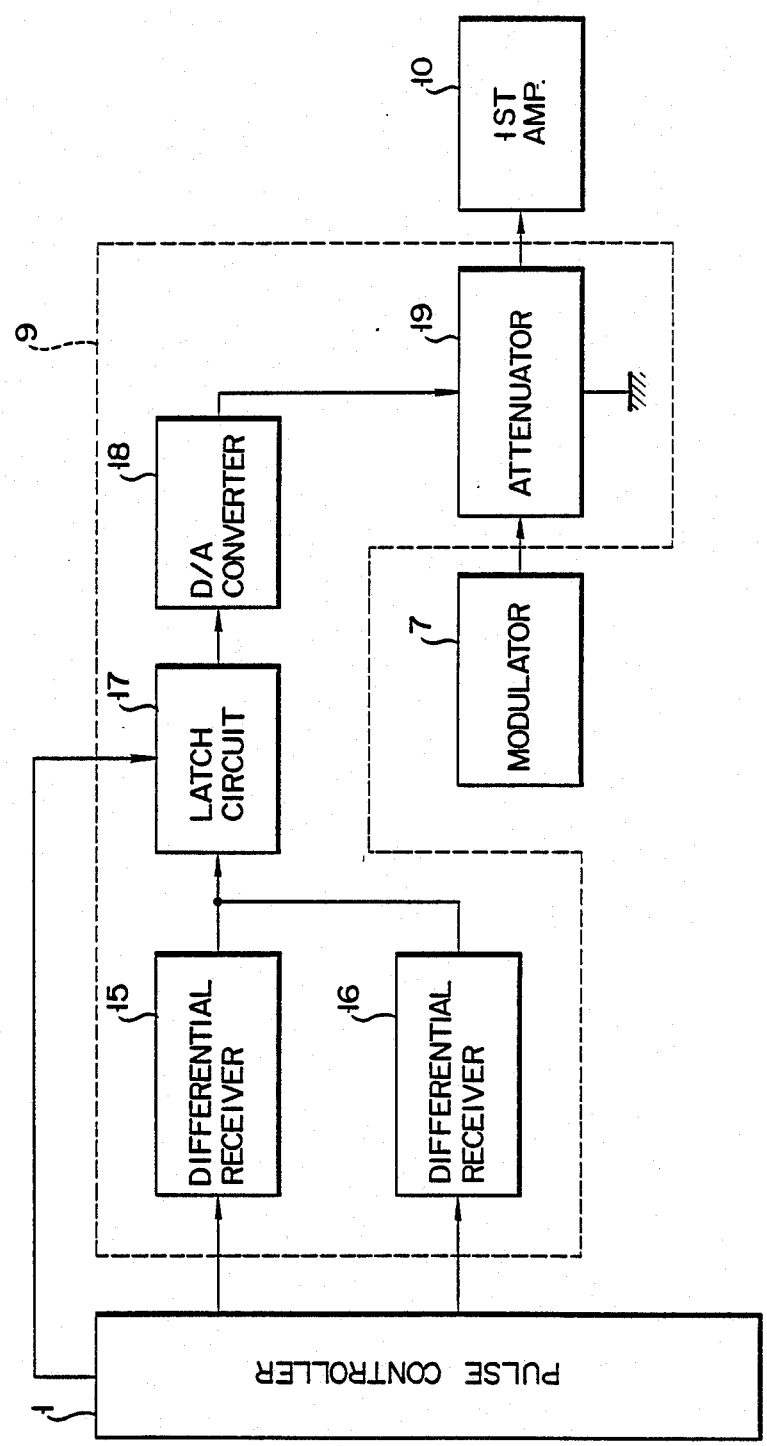
FIG. 5 is a block diagram showing a detailed arrangement of a power controller in the arrangement of FIG. 4.

Power controller 9 will then be explained in detail with reference to FIG. 5 showing its arrangement.

As shown in FIG. 5, power controller 9 comprises: differential receivers 15 and 16; a latch circuit 17; a D/A (digital-to-analog) converter 18; and an attenuator 19.

Differential receivers 15 and 16 receive (digital) control signals which are transmitted from transmitting pulse controller 1. Receivers 15 and 16 receive high order bits and low order bits of the control signals, respectively. Latch circuit 17 latches the control signals which are outputted from receivers 15 and 16 in response to a timing signal which is supplied by controller 1. D/A converter 18 converts the digital signal latched in latch circuit 17 to an analog signal. Attenuator 19 is interposed between modulator 7 and first amplifier 10 and its impedance varies depending on an output of D/A converter 18, thereby changing a signal which is supplied from modulator 17 to first amplifier 10. Namely, attenuator 19 controls an output current of modulator 7 and the resultant output which was current controlled is inputted to first amplifier 10.

The operation of the system constituted in this manner will then be described.

Before starting irradiation of the object, the transmitting pulse power is set by controller 1 in the following manner.

When the system is installed, the condition to generate the 90° or 180° pulse is adjusted manually. This condition can be automatically controlled to provide the correct 90° or 180° pulse as will be explained below.

Upon examination, controller 1 first supplies a control signal to transmitter 2, and transmitter 2 operates in response to this control signal, so that the excitation rotating magnetic field is applied to the object within the transmitter coil 3. The spin echo signal which is generated from the object is received by receiver 5 through receiver coil 4 and input to controller 1.

Controller 1 detects and holds the peak value of the input spin echo signal and simultaneously varies attenuator 19 in power controller 9 to change the transmitting pulse power and applies the excitation rotating magnetic field to the object in a manner similar to the above. Then, controller 1 holds the new peak value of the spin echo signal in association with the change of the transmitting pulse power.

In this manner, on the basis of a plurality of spin echo signals collected by changing the transmitting pulse power, controller 1 determines the transmitting pulse power, Pmax, at which the peak value of the spin echo signal is a maximum, namely, the control state of attenuator 19 in power controller 9. In accordance with this control state, the transmitting pulse power according to the attribute of the object is initially set. In other words, even when an object is put in transmitter coil 3 and the value of Q varies due to the attributes of the object, the power condition to generate the 90° pulse or 180° pulse is properly set in accordance with the attribute of the object. In this way, the 90° and/or 180° angle of inclination of the magnetic moment and the corresponding power Pmax are accurately determined. Subsequently, the fractional power $P_F$ is selected to achieve the desired spin angle less than 90° to thereby decrease the time needed for data collection due to the spin-lattice relaxation time $T_1$. Most preferably, the spin rotation angle is selected to be 45°.

After completion of the adjustment as mentioned above, the excitation rotating magnetic field is applied to the object with the determined transmitting pulse power, $P_F$, and the MR signals are collected from the object through receiver coil 4.

The MR signals collected from the object are subjected to an image reconstituting process, so that a distribution image of the MR data is obtained. This image reconstituting process is similar to the process in the conventional system; therefore, its description is omitted.

As described above, this system is provided with transmitting pulse controller 1 for setting an angle of inclination of the magnetic moment of the spin system to a predetermined value less than 90° and preferably about 45° by controlling the transmitting pulse power which is used to generate the excitation rotating magnetic field in accordance with the attribute of the object. The object s irradiated with the transmitting pulse power which is set at a selected fraction of the transmitting pulse power at which the peak value of the received echo signal from the object is maximized by transmitting pulse controller 1. Therefore, this system does not ignore the quality factor Q which varies depending on the shape or the like of the object as in existing systems, so that the power condition can be suitably set independently of the attributes of the object and uniform magnetic resonance images can be obtained. Moreover, data collection times are reduced in comparison with those wherein the spin angle is set to 90° or 180° which improves patient acceptance of the NMR process. Also, since the MR signal, e.g., spin echo which is detected by the receiving system for use in the inherent MR measurement, is detected and controlled, the arrangement of the apparatus is also rational and the apparatus does not become more complicated than necessary.

Although the invention has been described with respect to a preferred embodiment, the invention is not limited to the foregoing embodiment; various changes and modifications which are obvious to a person skilled in the art to which the invention pertains are deemed to lie within the spirit and scope of the invention.

For example, in the system in the foregoing embodiment, attenuator 19 in power controller 9 may be changed to vary the amplitude of the transmitting pulse, thereby controlling the transmitting pulse power. However, since the transmitting pulse power changes due to the amplitude and/or width of the transmitting pulse, the amplitude and/or width of the modulating pulse may be changed by selector 8 shown in FIG. 4 and the pulse amplitude and/or pulse width of the modulating wave (output of oscillator 6) is changed, and the transmitting pulse power can also be changed. Therefore, in this case, transmitting pulse controller sets the transmitting pulse power through selector 8. With this method, an effect similar to that in the foregoing embodiment can be also obtained.

Further, although the system in which the spin echo signal is received has been described in the above embodiment, the invention can also be applied to a system in which the FID signal is received in a manner similar to the above.

The present invention is not limited to the system described above, wherein the projection reconstruction method is employed. It can be applied to an MR imaging system which uses a so-called Fourier transformation method such as the spin warp method, wherein excitation pulses are applied to an object, a magnetic field inclined in a specified direction is applied to the object, thus phase-modulating MR signals, and the modulated signals are Fourier-transformed.

What is claimed is:

1. A magnetic resonance imaging system comprising:
   magnetic field generating means for generating a static magnetic field and a gradient magnetic field which are applied to an object;
   means for applying an excitation magnetic field to cause a magnetic resonance to occur in said object to which said static magnetic field and said gradient magnetic field have been applied, said excitation field applying means including power control means for controlling a power of the excitation magnetic field;
   means for receiving a magnetic resonance signal due to the magnetic resonance which is caused from the object under applications of said static magnetic field, said gradient magnetic field, and said excitation magnetic field; and
   said power control means responsive to the magnetic resonance signal which is received by said receiving means so, to control the power of said excitation magnetic field to rotate an angle of inclination of a spin of nuclei of said object to a predetermined value less than 90° when said object is placed in a combined field of said static, gradient and excitation magnetic fields.

2. A magnetic resonance imaging system according to claim 1, wherein said magnetic resonance signal is a spin echo signal which is produced due to the magnetic resonance.

3. A magnetic resonance imaging system according to claim 1, wherein said magnetic resonance signal is an FID signal which is produced due to the magnetic resonance.

4. A magnetic resonance imaging system according to claim 1, wherein said predetermined value of the angle of inclination is about 45°.

5. A magnetic resonance imaging system according to claim 1, wherein said power control means includes means for controlling an amplitude of a signal to generate the excitation magnetic field.

6. A magnetic resonance imaging system according to claim 1, wherein said power control means includes means for controlling a time width of a signal to generate the rotating magnetic field.

7. A magnetic resonance imaging system according to claim 1, wherein said power control means includes means for controlling an amplitude and a time width of a signal to generate the excitation magnetic field.

8. A magnetic resonance imaging system as recited in claim 1 wherein said power control means includes:
   means for varying the power for the excitation magnetic fields,
   means responsive to the maximum value of said received magnetic resonance signal obtained by varying said power for determining the transmission power, Pmax, corresponding to said maximum magnetic resonance signal, and
   means for applying a fraction $P_F$ of said power Pmax to generate said excitation magnetic field.

9. A magnetic resonance imaging system as recited in claim 8 further including image reconstruction processing means for reconstructing a magnetic resonance image form magnetic resonance signals received by said receiving means when said power control means controls said excitation magnetic field at said fraction of said transmission power corresponding to said maximum magnetic resonance signal.

10. A magnetic resonance imaging system comprising:
    magnetic field generating means for generating a static magnetic field and a gradient magnetic field which are applied to an object;
    means for applying an excitation magnetic field to cause a magnetic resonance to occur in said object to which said static magnetic field and said gradient magnetic field have been applied, said excitation field applying means including power control means for controlling a power of the excitation magnetic field;
    means for receiving a magnetic resonance signal due to the magnetic resonance which is caused in the object due to said static magnetic field, said gradient magnetic field, and said excitation magnetic field;
    image reconstruction processing means for reconstructing a magnetic resonance image from the magnetic resonance signal which is received by said receiving means; and
    said power control means responsive to said magnetic resonance signal for controlling the power of the excitation magnetic field to be a maximum value Pmax, irrespective of attributes of said object, and for subsequently controlling said power to be a fraction, $P_F$, of the value of Pmax so as to rotate a spin of specific nuclei of said object to a predetermined flip angle which is less than 90° when said object is placed in a combined field resulting from said static, gradient and excitation magnetic fields.

11. A method of magnetic resonance imaging comprising the steps of:
    generating a static magnetic field and a gradient magnetic field and applying the static and gradient magnetic fields to an object to be examined;
    applying an excitation magnetic field to cause a magnetic resonance to occur in said object;
    receiving a magnetic resonance signal due to the magnetic resonance which is caused from the object under application of the static magnetic field, the gradient magnetic field, and the excitation magnetic field; and
    controlling a power of the excitation magnetic field in response to said magnetic resonance signal to be a maximum value Pmax and subsequently controlling the power to be a fraction, $P_F$, of $P_{max}$ so as to rotate an angle of inclination of a spin of nuclei of said object to a predetermined value less than 90° when the object is placed in a combined field of said static, gradient and excitation magnetic fields.

12. A magnetic resonance imaging method as recited in claim 11 wherein said step of controlling the power of said excitation magnetic field includes controlling the power of said excitation magnetic field so as to rotate the angle of inclination of the spin of nuclei of said object to a predetermined value of 45°.

13. The method as recited in claim 11 wherein said step of controlling the power of said excitation magnetic field includes varying said power for determining the transmission power corresponding to a maximum magnetic resonance signal and applying a fraction of said determined power to generate said excitation magnetic field.

* * * * *